United States Patent [19]
New et al.

[11] Patent Number: 6,057,704
[45] Date of Patent: May 2, 2000

[54] PARTIALLY RECONFIGURABLE FPGA AND METHOD OF OPERATING SAME

[75] Inventors: Bernard J. New, Los Gatos; Charles R. Erickson, Fremont, both of Calif.

[73] Assignee: Xilinx, Inc., San Jose, Calif.

[21] Appl. No.: 08/990,154

[22] Filed: Dec. 12, 1997

[51] Int. Cl.[7] .......................... H03K 19/177; G06F 7/38; G11C 16/04; G11C 8/00
[52] U.S. Cl. ............................. 326/38; 326/40; 326/41; 365/189.08; 365/230.06
[58] Field of Search ................... 326/38, 40, 39, 326/41; 365/189.09, 230.06, 230.03, 189.08

[56] References Cited

U.S. PATENT DOCUMENTS

| | | | |
|---|---|---|---|
| Re. 34,363 | 8/1993 | Freeman | 307/465 |
| 4,829,479 | 5/1989 | Mitsumoto et al. | 365/189.09 |
| 5,214,327 | 5/1993 | Saeki et al. | 326/38 |
| 5,600,263 | 2/1997 | Trimberger et al. | 326/39 |
| 5,801,547 | 9/1998 | Kean | 326/40 |
| 5,847,577 | 12/1998 | Trimberger | 326/38 |

OTHER PUBLICATIONS

"The Programmable Logic Data Book", (1996) pp. 4–21 to 4–23, available from Xilinx, Inc., 2100 Logic Drive, San Jose, California 95124.

"The Programmable Logic Data Book", (1994) pp. 2–20 to 2–21, available from Xilinx, Inc., 2100 Logic Drive, San Jose, California 95124.

*Primary Examiner*—Michael J. Tokar
*Assistant Examiner*—Daniel D. Chang
*Attorney, Agent, or Firm*—E. Eric Hoffman; Edel M. Young

[57] ABSTRACT

A field programmable gate array (FPGA) having an array of configuration memory cells arranged in rows and columns. The configuration memory cells store configuration data values for configuring the FPGA. Each configuration memory cell is coupled to a corresponding row line through a corresponding cell access transistor. A row access circuit is coupled to the row lines. To re-program a first set (but not a second set) of configuration memory cells in a column, the row access circuit initially pre-charges each of the row lines, and then provides configuration data values on a first set (but not a second set) of the row lines. All cell access transistors in the column are coupled to a column select line. To avoid losing data in any memory cell, a relatively low read voltage, followed by a higher write voltage, is applied to the column select line. When the read voltage is applied to the column select line, the associated cell access transistors are weakly turned on. As a result, the row lines are charged to states which correspond to the configuration data values stored by the configuration memory cells. Consequently, when the write voltage is subsequently applied to the column select line, configuration data values stored by the second set of configuration memory cells are not disturbed.

25 Claims, 7 Drawing Sheets

PARTIALLY RECONFIGURABLE FPGA AND METHOD OF OPERATING SAME

RELATED APPLICATION

This application relates to commonly owned co-filed U.S. patent application Ser. No. 08/989,980, which is hereby incorporated by reference in its entirety.

BACKGROUND OF THE INVENTION

1. Field of the Invention

The present invention relates to a field programmable gate array (FPGA) which is reconfigured in response to configuration data values which are transferred from a frame register to an array of configuration memory cells. More specifically, the present invention relates to a method and structure for enabling the partial reconfiguration of such an FPGA.

2. Discussion of Related Art

FIG. 1 is a schematic diagram of a portion of a conventional FPGA 100. FPGA 100 includes a frame register 110 which receives and stores a plurality of configuration data values. These configuration data values are typically received from an external source. The configuration data values are transferred from frame register 110 to an array of configuration memory cells, which includes configuration memory cells 151–156. The configuration data values stored in configuration memory cells 151–156 are provided to control predetermined programmable interconnection points (PIPs) and to define lookup table contents. The PIPs and lookup tables configure the FPGA in response to the configuration data values. Such a configuration structure is discussed by Freeman in U.S. Pat. No. Re 34,363 (See, particularly FIG. 5), which is hereby incorporated by reference in its entirety.

The configuration memory cells 151–156 are arranged in an array of rows and columns. Thus, configuration memory cells 151 and 152 are in a first row of the array, and configuration memory cells 151, 153 and 155 are in a first column of the array. The configuration data values are written from frame register 110 to the array on a column-by-column basis. For example, configuration data values are written to the first column of the array as follows. First, the configuration data values to be written to the first column are stored in frame register 110. A logic high write enable signal WE is then applied to the gates of row access transistors 111–113, thereby turning on these transistors. As a result, the configuration data values are routed from frame register 110, through write buffers 101–103 and row access transistors 111–113, to row lines 121–123. A logic high column select signal (CS1) is asserted on a column select line 131. This column select line 131 is coupled to cell access transistors 141, 143 and 145 (i.e., the cell access transistors associated with the first column of the array). The logic high CS1 signal turns on the cell access transistors 141, 143 and 145, thereby allowing the configuration data values to be written to the associated configuration memory cells 151, 153 and 155. Other configuration data values are written to the other columns of the array in the same manner until the FPGA is completely configured.

The asserted column select signal (CS1) has a full Vcc supply voltage of 5 Volts during a write operation. This high voltage ensures that the cell access transistors 141, 143 and 145 are sufficiently biased (i.e., turned on hard) to enable the configuration data values to be written to the associated configuration memory cells.

The configuration data values can also be read from the configuration memory cells to frame register 110. Like the write operations, the read operations are performed on a column-by-column basis. However, read operations are slightly more complicated than write operations because each of the row lines 121, 122 and 123 has an associated parasitic capacitance 121C, 122C and 123C. Because the row lines 121–123 are relatively long, these capacitances 121C–123C are large enough to store charges which are capable of changing the state of the configuration memory cells during a read operation if the associated cell access transistors are fully turned on.

Accordingly, during a read operation, all of the row lines 121–123 are pre-charged to a logic high voltage level. Next, the cell access transistors are biased with a reduced voltage column select signal. The cell access transistors are biased with a reduced voltage for the following reason. If the cell access transistors were biased with a full Vcc supply voltage of 5 Volts, then the effective impedance of the cell access transistors would be relatively small. As a result, the charges stored by the row line capacitances could be sufficient to flip the states of those configuration memory cells storing logical 0's.

In one example, after the row line capacitances 121C–123C are pre-charged to the Vcc supply voltage (i.e., 5 Volts), the column select signal CS1 is asserted at a reduced voltage of 2.5 Volts. The reduced voltage column select signal CS1 causes cell access transistors 141, 143 and 145 to turn on weakly. At this time, cell access transistors 141, 143 and 145 exhibit relatively high impedances. Under these conditions, those configuration memory cells which store logic low data values cause the associated row lines to discharge. For example, if configuration memory cell 151 stores a logic low data value, then the pre-charged row line capacitance 121C is discharged through the weakly turned on cell access transistor 141. As a result, the status of configuration memory cell 151 is not disturbed during the read operation.

The pre-charged row lines also help to maintain the status of configuration memory cells which store logic high data values. For example, if configuration memory cell 153 stores a logic high data value, then the pre-charged status of row line 122 prevents the row line capacitance 122C from pulling down configuration memory cell 153 when the column select signal CS1 is asserted. As a result, the status of configuration memory cell 153 is not disturbed during the read operation.

As previously discussed, all write operations and all read operations must be performed on a column-by-column basis. The previously described operating parameters prohibit the partial reconfiguration of a column. That is, it is not possible to write configuration data values to fewer than all of the configuration memory cells in a column. As a result, the reconfiguration of conventional FPGAs is undesirably limited.

It would therefore be desirable to have an FPGA with partially reconfigurable columns of configuration memory cells. That is, it is desirable to have an FPGA in which selected configuration memory cells within a column of configuration memory cells can be reconfigured.

SUMMARY

Accordingly, the present invention provides an FPGA which includes at least one column of configuration memory cells. Each of the configuration memory cells in the column stores a configuration data value which is used to configure the FPGA. Each of the configuration memory cells is coupled to a corresponding row line through a corresponding cell access transistor. A row access circuit is coupled to the row lines. When re-programming a first set of the configuration memory cells in the column (and not re-programming a second set of the configuration memory cells in the column), the row access circuit provides the desired configuration data values on a first set of the row lines (and does not provide configuration data values to a second set of the row lines).

A column select line is coupled to the gate of each of the cell access transistors in the column. The column select line, in turn, is coupled to a column access circuit. When the first set of configuration memory cells are to be re-programmed, each of the row lines is pre-charged to a logic high voltage. The column access circuit is then controlled to apply a read voltage, followed by a write voltage, to the column select line. Both the read voltage and the write voltage are greater than the threshold voltage of the cell access transistors, and the write voltage is greater than the read voltage. In one embodiment, the read voltage is about 2.5 Volts and the write voltage is about 5 Volts. If the chip is designed to operate with a lower supply voltage, the read and write voltages are correspondingly lower. In particular embodiments, the write voltage is approximately equal to the supply voltage and the read voltage is approximately half of the supply voltage.

When the read voltage is applied to the column select line, the associated cell access transistors are weakly turned on (i.e., not fully turned on). At this time, the cell access transistors exhibit relatively high impedances. These impedances cause the second set of row lines (which were previously charged high) to be charged to states which correspond to the configuration data values currently stored by the configuration memory cells, without allowing the configuration memory cells to lose their stored configuration data values. Consequently, when the write voltage is subsequently applied to the column select line, the second set of row lines are appropriately charged so as not to disturb the configuration data values stored in the second set of configuration memory cells. When the write voltage is applied to the column select line, the new configuration data values are written to the first set of configuration memory cells.

The present invention also includes a method for partially reconfiguring an FPGA. In this method, the FPGA includes at least one column of configuration memory cells. Each configuration memory cell has an associated cell access transistor, and stores a configuration data value which is used to configure the FPGA. The method includes the steps of (1) providing one or more configuration data values to a subset of the cell access transistors in the column; and (2) applying a column select signal to turn on each of the cell access transistors in the column, wherein the column select signal comprises a read voltage followed by a write voltage, wherein both the read voltage and the write voltage are greater than the threshold voltage of the cell access transistors, and wherein the write voltage is greater than the read voltage.

The present invention advantageously enables the partial reconfiguration of an FPGA. The present invention will be more fully understood in view of the following description and drawings.

DETAILED DESCRIPTION

Figure 2:
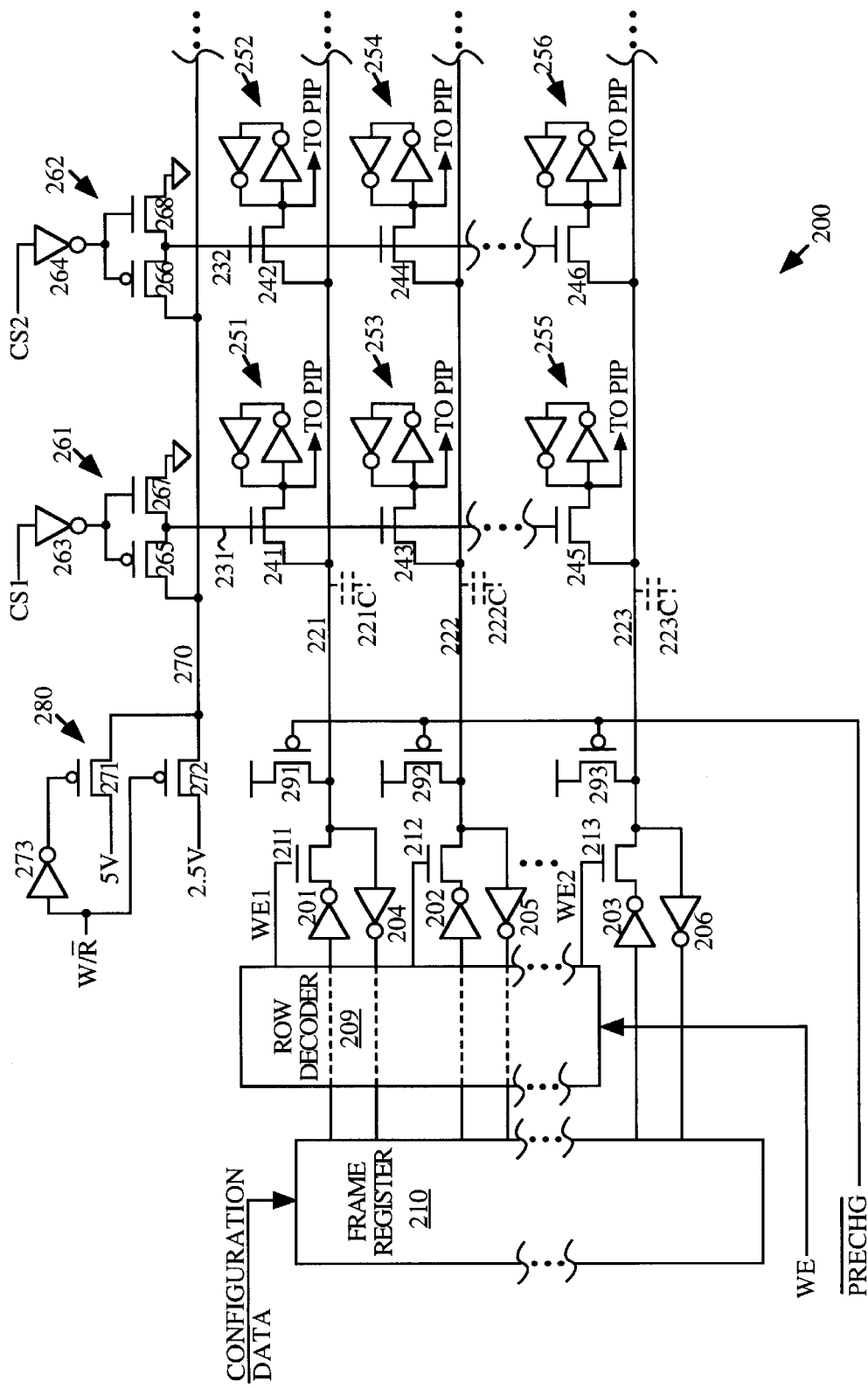
FIG. 2 is a schematic diagram of a portion of an FPGA in accordance with the invention.

FIG. 2 is a schematic diagram of a portion of an FPGA 200 in accordance with one embodiment of the present invention. FPGA 200 includes frame register 210, row decoder 209, write buffers 201–203, read buffers 204–206, row access transistors 211–213, row lines 221–223 and associated parasitic capacitances 221C–223C, row pull-up transistors 291–293, column select lines 231–232, cell access transistors 241–246, configuration memory cells 251–256, column select circuits 261–262, column voltage line 270 and column voltage circuit 280. Column select circuits 261 and 262 include inverters 263–264, p-channel field effect transistors (FETs) 265–266 and n-channel FETs 267–268. Column voltage circuit 280 includes p-channel FETs 271–272 and inverter 273. Together, frame register 210, row decoder 209, write buffers 201–203, read buffers 204–206 and row access transistors 211–213 form a row access circuit. Similarly, column voltage circuit 280 and column select circuits 261 and 262 form a column access circuit.

Frame register 210 receives and stores a plurality of configuration data values. These configuration data values are typically received from an external source, but can also be received from an internal source. In one embodiment, the configuration data values are serially shifted into frame register 210. However, in other embodiments, the configuration data values are shifted into frame register 210 several bits in parallel. As described in more detail below, the configuration data values are transferred from frame register 210 to an array of configuration memory cells, which includes configuration memory cells 251–256. As also described in more detail below, the configuration data values can be written from frame register 210 to the array of configuration memory cells on a full column or partial column basis. The configuration data values can be read from the array to frame register 210 on a full column basis.

The configuration data values stored in configuration memory cells 251–256 are provided to control predetermined programmable interconnection points (PIPs) and define lookup table contents. The PIPs and lookup tables, in response to the configuration data values, configure the FPGA. The configuration data values can also be read from configuration memory cells 251–256 to frame register 210.

Each of configuration memory cells 251–256 is formed by a pair of CMOS inverters which are cross-coupled to form a latch. The configuration memory cells 251–256 are arranged in an array of rows and columns. Thus, configuration memory cells 251 and 252 are in a first row of the array, configuration memory cells 253 and 254 are in a second row of the array, and configuration memory cells 255 and 256 are in the last row of the array. Similarly, configuration memory cells 251, 253 and 255 are in a first column of the array and configuration memory cells 252, 254 and 256 are in a second column of the array. Although the invention is described in connection with three rows and two columns of configuration memory cells, it is understood that FPGA 200 typically has many more rows and columns of configuration memory cells. For example, a medium sized FPGA 200 can include a 32×32 array of configurable logic blocks (CLBs), with each CLB having 18 rows and 48 columns of configuration memory cells. In this example, FPGA 200 would have 576 rows (18×32) of configuration memory cells and 1536 columns (48×32) of configuration memory cells. Frame register 210 can be located on one side of the array of configuration memory cells as illustrated in FIG. 2. Alternatively, frame register 210 can extend through a central location of the array of configuration memory cells, or there can be more than one frame register in FPGA 200.

Each of configuration memory cells 251–256 is coupled to one of row lines 221–223 through an associated cell access transistor 241–246. The source of each cell access transistor is coupled to an associated row line, and the drain of each cell access transistor is coupled to an associated configuration memory cell. Row lines 221–223, in turn, are coupled to associated write buffers 201–203, respectively, through associated row access transistors 211–213, respectively. Row lines 221–223 are also coupled to associated read buffers 204–206, respectively. Row lines 221–223 are relatively long lines which extend substantially across the width of FPGA 200, and connect to diffusion regions of many cell access transistors. As a result, each of the row lines 221–223 has a significant associated parasitic capacitance. The capacitances 221C–223C associated with row lines 221–223 are shown in dashed lines in FIG. 2.

Each of write buffers 201–203 and read buffers 204–206 is coupled to frame register 210 as illustrated. The gate of each of the row access transistors 211–213 has a dedicated connection to row decoder 209. As a result, any number of the row access transistors 211–213 can be enabled at any given time. As described in more detail below, row decoder 209 helps to enable the partial reconfiguration of FPGA 200.

Pull-up transistors 291–293 are turned on by asserting an active low $\overline{\text{PRECHG}}$ signal, thus pulling lines 221–223 high.

The cell access transistors associated with each column of the array of configuration memory cells are connected to an associated column select line. Thus, the gates of cell access transistors 241, 243 and 245 are coupled to column select line 231. Similarly, the gates of cell access transistors 242, 244 and 246 are coupled to column select line 232.

Each of the column select lines 231–232, in turn, is connected to an associated column select circuit 261–262, respectively. Column select circuits 261 and 262 are included so that a choice of voltages (i.e., a read voltage or a write voltage) can be provided from column voltage line 270 to column select lines 231 and 232. Column select circuit 261 includes an inverter 263 which is coupled to receive a column select signal CS1. The output terminal of inverter 263 is coupled to the gates of p-channel FET 265 and n-channel FET 267. The drain and source regions of n-channel FET 267 are connected to column select line 231 and ground (the off voltage), respectively. The source and drain regions of p-channel FET 265 are coupled to column voltage line 270 and column select line 231, respectively. Column select circuit 262 is connected to column select line 232 in a similar manner.

Column voltage line 270 is coupled to column voltage supply circuit 280 as illustrated. Thus, the drains of p-channel FETs 271 and 272 are coupled to column voltage line 270. The sources of p-channel FETs 271 and 272 are coupled to receive voltages of 5 Volts and 2.5 Volts, respectively. The Vcc supply voltage of FPGA 200 is 5 Volts. The 2.5 Volt signal is hereinafter referred to as a read voltage signal, and the 5 Volt signal is hereinafter referred to as a write voltage signal. Both the read voltage and the write voltage are greater than the threshold voltage of the cell access transistors, and the write voltage is greater than the read voltage. If the chip is designed to operate with a supply voltage of less than 5 Volts, the read and write voltages are correspondingly lower. In particular embodiments, the write voltage is approximately equal to the supply voltage and the read voltage is approximately half of the supply voltage. Thus, in a 3.3 Volt system, the write voltage would be about 3.3 Volts and the read voltage would be about 1.65 Volts, and in a 2.5 Volt system, the write voltage would be about 2.5 Volts and the read voltage would be about 1.25 Volts.

The gate of p-channel FET 272 is coupled to receive a control signal (W/$\overline{\text{R}}$). The gate of p-channel FET 271 is coupled to receive the inverse of the control signal (W/$\overline{\text{R}}$) (as inverted by inverter 273).

Configuration data values are written to the array of configuration memory cells of FPGA 200 as follows. First, the configuration data values are stored in frame register 210. There are two options for transferring the configuration data values from frame register 210 to the array of configuration memory cells. In a first write option, configuration data values are simultaneously transferred from frame register 210 to an entire column of configuration memory cells (i.e., full configuration). In a second write option, configuration data values are transferred from frame register 210 to a partial column of the configuration memory cells (i.e., partial configuration).

Full Configuration

The first write option (i.e., full configuration) will now be described. In the first write option, frame register 210 provides a configuration data value to each of the write buffers 201–203. In addition, row decoder 209 provides logic high write enable signals to all of the row access transistors 211–213. As a result, all of the row access transistors 211–213 are turned on, thereby coupling all of the write buffers 201–203 to their associated row lines 221–223. Write buffers 201–203 are large enough to quickly overcome any residual charges stored by row line capacitances 221C–223C.

In addition, one of the column select signals is asserted at a logic high value. In the described example, column select signal CS1 is asserted at a logic high value. As a result, p-channel FET 265 is turned on and n-channel FET 267 is turned off, thereby coupling column select line 231 to column voltage line 270.

Within column voltage circuit 280, the control signal (W/$\overline{\text{R}}$) is controlled to have a logic high value, thereby turning on p-channel FET 271 and turning off p-channel FET 272. As a result, column voltage line 270 is connected to receive a 5 Volt supply voltage (i.e., the write voltage signal). Cell access transistors 241, 243 and 245, which are now connected to column voltage line 270, are therefore fully turned on in response to a 5 Volt signal. As a result, the configuration data values are written from frame register 210 to the configuration memory cells 251, 253 and 255 in the first column of the array.

If it is desired to write identical information into more than one column, then the same frame register data can be loaded into more than one column without being reloaded into the frame register. Several columns can be loaded either sequentially or simultaneously. Such a process is useful for testing FPGAs.

Partial Configuration

Figure 3A:
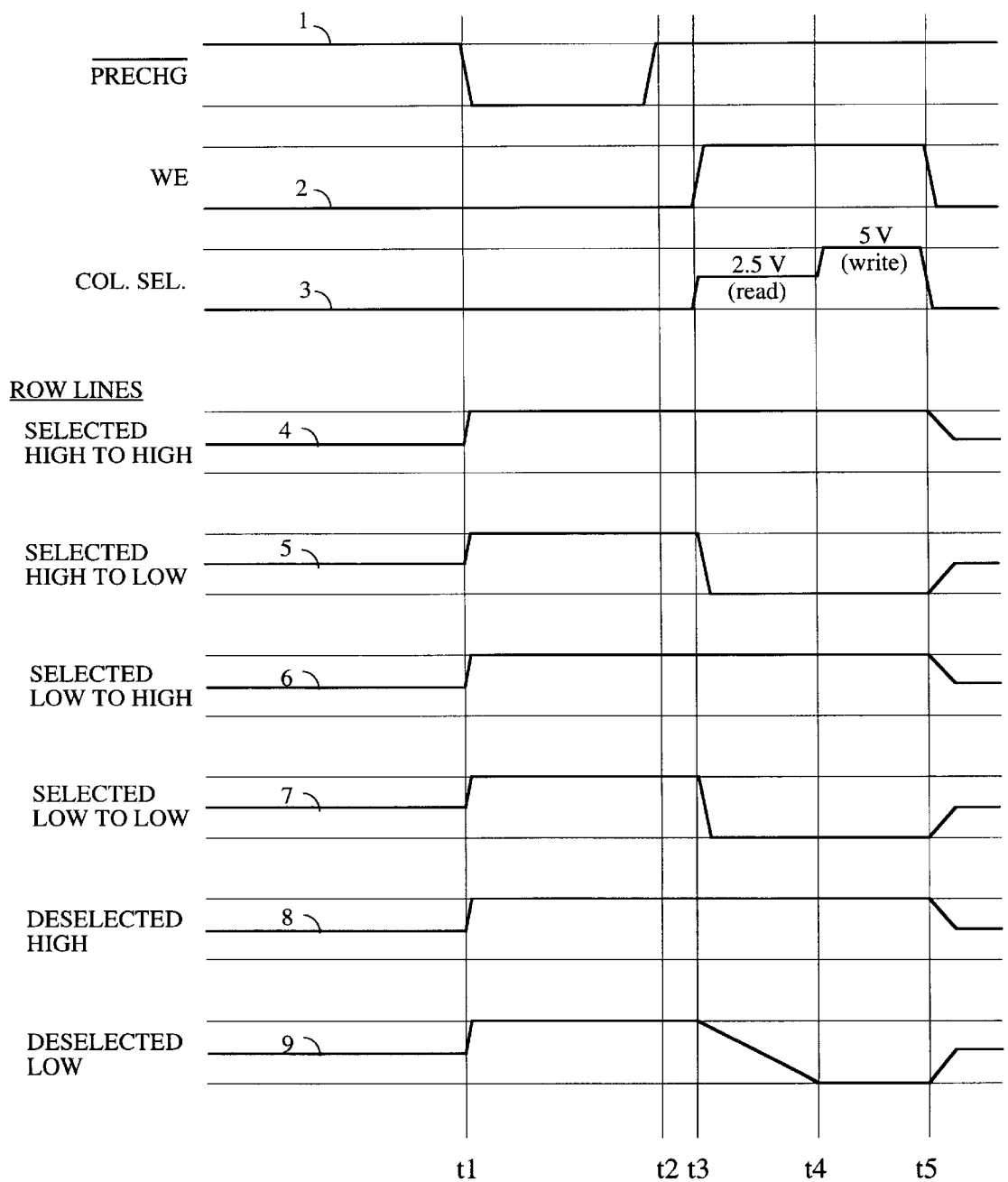
FIGS. 3A and 3B are waveform diagrams which describe the partial configuration of the FPGA of FIG. 2 in accordance with one embodiment of the invention.
Figure 3B:
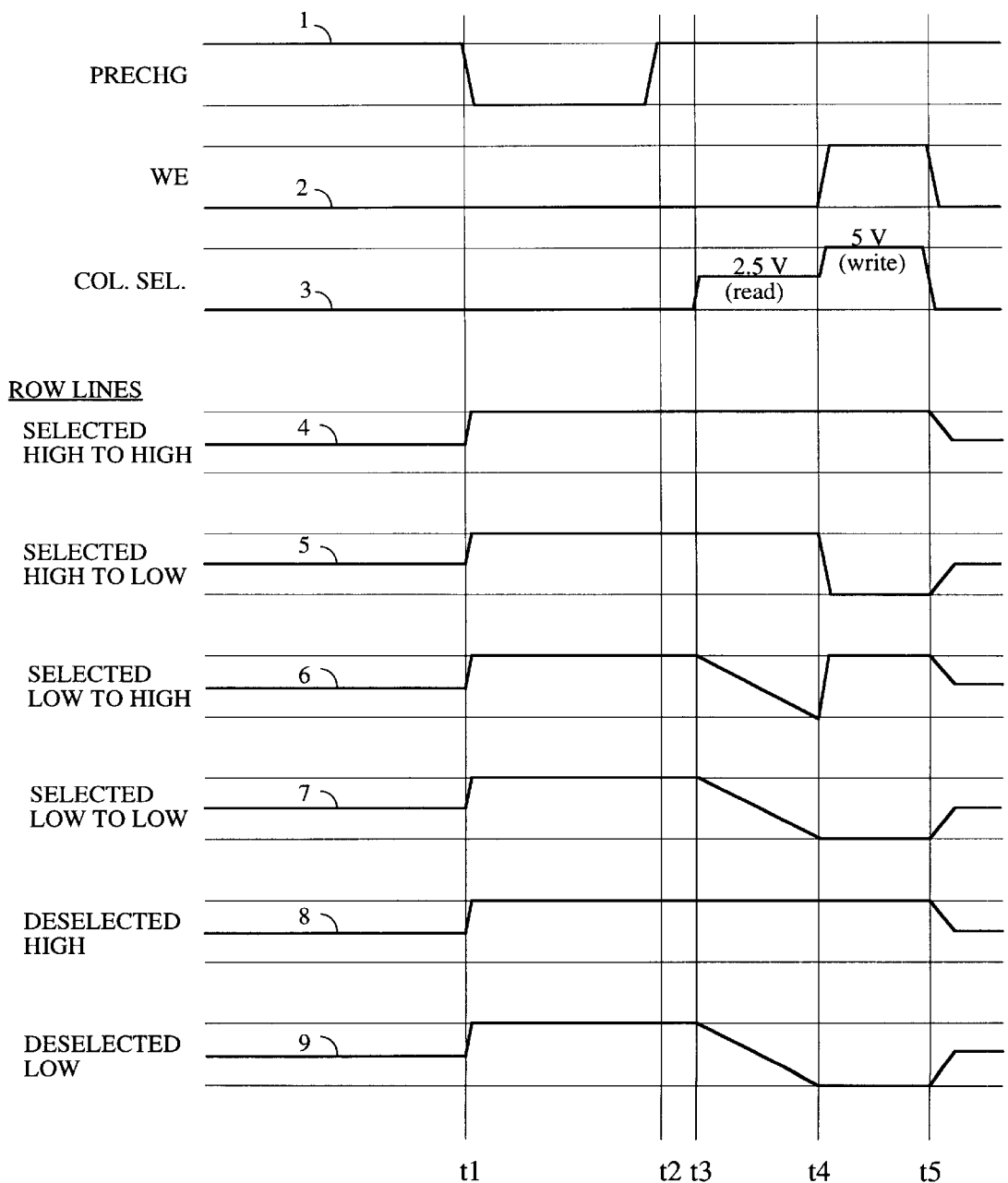

The second write option (partial configuration) will now be described. FIGS. 3A and 3B illustrate two possible timing sequences of the second write option. In both FIGS. 3A and 3B, all of the row lines 221–223 are initially pre-charged by asserting an active low $\overline{\text{PRECHG}}$ signal from time t1 to time t2, and thereby turning on transistors 291–293, as illustrated by pre-charge waveform 1. Thus, each of the row line capacitances 221C–223C is pre-charged to a voltage of about 5 Volts.

FIG. 3A

After the row lines 221–223 have been pre-charged, frame register 210 provides the desired configuration data values to a subset of the write buffers 201–203. In the described embodiment, configuration data values are provided to write buffers 201 and 202, but not to write buffer 203.

At this time, row decoder 209 provides logic high write enable signals WE to a subset of the row access transistors 211–213 which corresponds to the selected subset of write buffers 201–203. The assertion of these write enable signals is illustrated by the rise at time t3 of write enable waveform 2 in FIG. 3A. As a result, some of the row access transistors 211–213 are turned on and some of the row access transistors 211–213 are turned off. In the described example, row decoder 209 provides logic high write enable signals to row access transistors 211 and 212, but not to row access transistor 213. Consequently, write buffers 201 and 202 are coupled to their associated row lines 221 and 222. Write buffers 201 and 202 thereby transmit the applied configuration data values onto row lines 221 and 222, respectively. Write buffers 201 and 202 are large enough to quickly overcome the charges previously stored by row line capacitances 221C and 222C during the pre-charge step.

In FIG. 3A, waveforms 4–7 represent the possible states of selected row lines 211 and 212.

Waveform 4 represents the case in which the selected memory cell, for example memory cell 252, has held a high value and will be written with a high value. Selected row line 221 is precharged high at time t1 and remains high until after the new high write value is placed onto line 221.

Waveform 5 represents the case in which the selected memory cell, again using the example of memory cell 252, has held a high value and will be written with a low value. At time t3, the new write value is applied to row line 221. There will be some contention between the high value in memory cell 252 and the low value on line 221. But this is acceptable because the time is short and at time t4, when the write voltage is applied to line 270, this new low value will be positively written into memory cell 252.

Waveform 6 represents the case in which memory cell 252 (or any other selected memory cell) has held a low value and will be written with a high value. As before, row line 221 is pulled high at time t1. At time t3, when the 2.5 Volt read voltage on line 270 weakly connects memory cell 252 to row line 221, there will be some contention between the low value in memory cell 252 and the high value on row line 221. Again, the time is short, and the contention may be acceptable. At time t4, the high value on row line 221 is written into memory cell 252.

Waveform 7 represents the case in which memory cell 252 holds a low value and will be written with a low value. At time t3, the new low value is applied to row line 221. At time t4 the low value is written to memory cell 252, though since memory cell 252 already held a low value it does not switch.

Because row decoder 209 does not provide a logic high write enable signal to row access transistor 213, row access transistor 213 remains off. As a result, row line capacitance 223C retains the charge previously stored during the pre-charge operation.

One of the column select signals is then asserted at a logic high value. In the described example, column select signal CS2 is asserted at a logic high value. As a result, p-channel FET 266 is turned on and n-channel FET 268 is turned off, thereby coupling column select line 232 to column voltage line 270.

Within column voltage circuit 280, the control signal (W/$\overline{\text{R}}$) is initially controlled to have a logic low value, thereby turning off p-channel FET 271 and turning on p-channel FET 272. As a result, column voltage line 270 is connected to receive the 2.5 Volt supply voltage (i.e., the read voltage signal). The assertion of the 2.5 Volt column select signal is illustrated in column select waveform 3 of FIG. 3A to occur at time t3. Cell access transistors 242, 244 and 246, which are now connected to column voltage line 270, are therefore turned on weakly in response to a 2.5 Volt signal. The read voltage signal is slightly greater than the threshold voltages of cell access transistors 242, 244 and 246.

The read voltage signal biases cell access transistors 242, 244 and 246 such that these cell access transistors are partially (i.e., weakly) turned on. That is, the read voltage signal biases cell access transistors 242, 244 and 246 in a manner consistent with a conventional read operation. Under these conditions, the impedances of cell access transistors 242, 244 and 246 are relatively high.

As a result of the somewhat high impedances of cell access transistors 242 and 244, the configuration data values provided by write buffers 201 and 202 are not yet written to configuration memory cells 252 and 254.

The high impedance of cell access transistor 246 causes configuration memory cell 256 to be coupled to the pre-charged row line 223 through a relatively high impedance. As described in more detail below, this condition allows the configuration memory cell 256 to be coupled to its associated row line 223 without changing the configuration data value stored by configuration memory cell 256.

In one instance illustrated in FIG. 3A by the DESELECTED HIGH row line waveform 8, configuration memory cell 256 stores a logic high configuration data value (i.e., 5 Volts). When cell access transistor 246 is partially turned at time t3 on by the 2.5 Volt read voltage signal, the row line capacitance 223C is coupled to configuration memory cell 256 through the high-impedance cell access transistor 246. When column select line CS2 applies a write voltage of 5 Volts at time t4, because both the row line capacitance 223C and the configuration memory cell 256 have a 5 Volt level, configuration memory cell 256 maintains a logic high configuration data value.

In the other instance represented by the DESELECTED LOW waveform 9, configuration memory cell 256 stores a logic low configuration data value (i.e., 0 Volts). When cell access transistor 246 is partially turned on at time t3 by the 2.5 Volt read voltage signal, the row line capacitance 223C is coupled to configuration memory cell 256 through the high-impedance cell access transistor 246. From time t3 to time t4, the row line capacitance 223C (which is initially at a 5 Volt level) discharges through the high-impedance cell access transistor 246. This discharge occurs because the row line capacitance 223C, which is initially at a 5 Volt level, is coupled by a high impedance to configuration memory cell 256, which has a 0 Volt level. As a result, when the write voltage of 5 Volts is applied to column select line CS2 at time t4, configuration memory cell 256 maintains a logic low configuration data value.

To summarize, the configuration memory cells which are not selected to receive configuration data values from frame register 210, but are in the selected column, are initially subjected to a read condition. During this read condition, the charges stored by the associated row line capacitances are made consistent with the configuration data values stored by the configuration memory cells.

After configuration memory cell 256 has had sufficient time to discharge row line capacitance 223C (if necessary), at time t4, the control signal ($\overline{\text{W/R}}$) is controlled to transition from a logic low state to a logic high state. As a result, p-channel FET 271 turns on and p-channel FET 272 turns off, thereby coupling column voltage line 270 (and column select line 232) to a 5 Volt supply (i.e., the write voltage signal). The 5 Volt column select signal is illustrated by column select waveform 3 in FIG. 3A. Like the read voltage signal, the write voltage signal is greater than the threshold voltages of cell access transistors 242, 244 and 246.

The write voltage signal applied at time t4 is sufficient to bias cell access transistors 242 and 244 such that the configuration data values provided by write buffers 201 and 202 on row lines 221 and 222 are written into configuration memory cells 252 and 254, respectively. That is, cell access transistors 242 and 244 are fully turned on (i.e., are turned on 'hard') by the write voltage signal.

The write voltage signal also causes cell access transistor 246 to be fully turned on. As previously described, the row line capacitance 223C was pre-charged, and then discharged if configuration memory cell 256 stores a logic low configuration data value. As also previously described, the row line capacitance 223C was pre-charged, and remained charged if configuration memory cell 256 stores a logic high configuration data value. Thus, the charge stored by row line capacitance 223C is consistent with the state of configuration memory cell 256 when the cell access transistor 246 is fully turned on. Consequently, the row line capacitance 223C does not disturb the state of configuration memory cell 256 when cell access transistor 246 is fully turned on.

FIG. 3B

In an alternative embodiment of the present invention illustrated in FIG. 3B, the row decoder 209 does not assert the write enable signals illustrated by waveform 2 until the column select signal transitions from a 2.5 Volt signal to a 5 Volt signal. In this embodiment, by precharging all row lines and then applying read voltages to all cell access transistors in the selected column from time t3 to time t4, each of the row lines 221–223 is charged to a state which is consistent with the state of its associated configuration memory cell. Then at time t4 when the write voltage is applied to all access transistors in the selected column, only those cells for which associated row lines are selected will be written because all deselected rows are at the voltage of their associated memory cells.

In this embodiment, the only contention between selected memory cells and selected row lines that have different voltages is during the actual writing operation immediately following time t4. Thus the embodiment of FIG. 3B may consume less power than FIG. 3A, and the embodiment of FIG. 3A is faster because at time t4 the row lines are already at the new values.

As with full reconfiguration, if it is desired to write identical information into more than one column, then the same frame register data can be loaded into more than one column without being reloaded into the frame register. However, unlike full configuration, only one column can be loaded at one time because the step of applying a read voltage to several columns would produce contention on the associated row line when the memory cells of two columns and the same row store different values.

Selection of Programming Duration

In one embodiment, the timing of the read and write voltage signals during the second write option is predetermined, with the duration of the read voltage signal being selected to ensure that the row line capacitances are discharged even under worst case conditions.

In another embodiment, the timing of the read and write voltage signals during the second write option is selected in response to an extra (dummy) row of configuration memory cells. The dummy row of configuration memory cells is connected in a manner similar to the previously described rows of configuration memory cells. However, the dummy configuration memory cells are not connected to PIPs or lookup tables. In addition, the dummy configuration memory cells are designed to be slightly slower than the previously described configuration memory cells.

The dummy row of configuration memory cells is operated as follows. Each of the dummy configuration memory cells is programmed to store a logic low configuration data value. The dummy row line is pre-charged at the same time as the previously described row lines. When the read voltage signal is asserted on the selected column select line, an associated dummy configuration memory cell is coupled to the dummy row line through a partially turned on dummy cell access transistor. At this time, the dummy row line capacitance discharges through the partially turned on dummy cell access transistor. A voltage detection circuit monitors the voltage level of the dummy row line and determines when the dummy row line capacitance has discharged to an acceptable level. Upon making this determination, the voltage detection circuit switches the state of the $\overline{\text{W/R}}$ signal, thereby causing the causes column voltage circuit 280 to stop supplying the read voltage signal and start supplying the write voltage signal. Designing the dummy configuration memory cells to be slower than the actual configuration memory cells ensures that the non-dummy row line capacitances will be discharged before the write voltage signal is applied. Using a dummy cell and dummy select line allows programming duration to be shortened close to the minimum safe level and thus allows configuration to occur at a faster rate than a worst case requirement would allow.

In one variation, the dummy row of configuration memory cells is replaced with a single dummy configuration memory cell which is coupled to a capacitance which is equivalent to the parasitic row line capacitance of one of the row lines 221–223. In this variation, the dummy cell access transistor of the single dummy configuration memory cell is coupled to each of the column select lines through a multiplexer. The row decoder 209 controls the multiplexer to couple the active column select line to the gate of the dummy cell access transistor.

In yet another variation, the dummy cell is replaced with a single inverter (i.e., a dummy inverter) having an input terminal which is hard-wired to receive the Vcc supply voltage (i.e., a logic high signal). As a result, the dummy inverter provides a logic low signal at its output terminal. The output terminal of the dummy inverter is coupled to a dummy row line through an associated dummy cell access transistor. The dummy inverter is designed to be slightly smaller than the inverters present in the normal configuration memory cells. As a result, dummy row line capacitance will discharge slower than the non-dummy row line capacitances.

The previously described second write option (partial configuration) advantageously allows selected configuration memory cells within a column to be re-programmed, without disturbing the non-selected configuration memory cells in the same column. As a result, an FPGA in accordance with the present invention can be partially reconfigured, thereby enhancing the programming flexibility of the FPGA.

Read Operation

Configuration data values are read from a column of the array of configuration memory cells as follows. Initially, all of the row lines 221–223 are pre-charged in the manner previously described. As a result, each of the row line capacitances 221C–223C is initially charged to a 5 Volt level. One of the column select signals is then controlled to have a logic high value, thereby selecting the column to be read. For example, the CS1 signal can be asserted, thereby coupling column select line 231 to the column voltage line 270. The control signal W/$\overline{R}$ is controlled to have a logic low value, thereby coupling the column voltage line 270 to a read voltage signal of 2.5 Volts. As a result, column select line 231 is held at a voltage of 2.5 Volts, thereby causing the associated cell access transistors 241, 243 and 245 to be weakly turned on. The configuration memory cells which store logic low configuration data values cause the associated row line capacitances to discharge in the manner previously described. Conversely, the configuration memory cells which store logic high configuration data values cause the associated row line capacitances to remain high (i.e., charged) in the manner previously described. As a result, the configuration data values stored by configuration memory cells 251, 253 and 255 are effectively read out to row lines 221, 222 and 223, respectively. The row lines 221, 222 and 223 route these configuration data values to read buffers 204, 205 and 206, respectively. Read buffers 204, 205 and 206, in turn, provide these configuration data values to frame register 210.

Alternative embodiments

Figure 4:
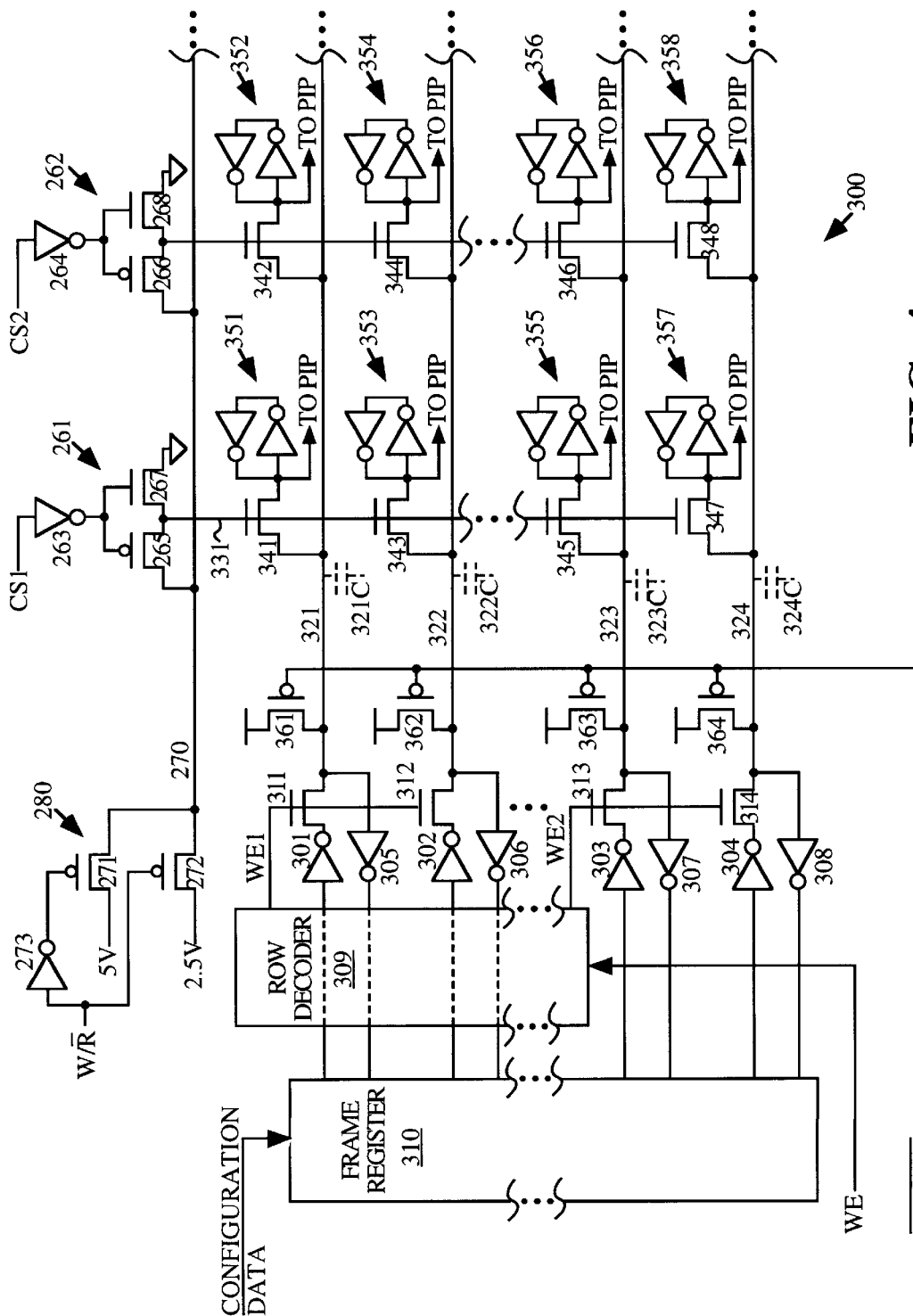
FIG. 4 is a schematic diagram of a portion of an FPGA in accordance with another embodiment of the present invention.

FIG. 4 is a circuit diagram of a portion of an FPGA 300 in accordance with another embodiment of the invention. Because FPGA 300 is similar to FPGA 200 (FIG. 2), similar elements in FIGS. 2 and 4 are labeled with similar reference numbers. Thus, FPGA 300 includes column select circuits 261–262, column voltage line 270 and column voltage circuit 280 as previously described. In addition, FPGA 300 includes frame register 310, row decoder 309, write buffers 301–304, read buffers 305–308, row access transistors 311–314, row lines 321–324, column select lines 331–332, cell access transistors 341–348 and configuration memory cells 351–358. The elements of FPGA 300 are connected in substantially the same manner as the previously described elements of FPGA 200.

The main difference between FPGA 200 and FPGA 300 is that row decoder 309 of FPGA 300 provides write enable signals to groups of row access transistors (as opposed to a single row access transistor). Thus, row decoder 309 provides a first write enable signal WE1 to the gates of row access transistors 311 and 312. Similarly, row decoder 309 provides a second write enable signal WE2 to the gates of row access transistors 313 and 314. Thus, row lines 321 and 322 are accessed as a first group in response to the first write enable signal WE1. Similarly, row lines 323 and 324 are accessed as a second group in response to the second write enable signal WE2. In a particular embodiment, the row lines are grouped such that each CLB of the FPGA 300 is coupled to a corresponding group of row lines. For example, if each CLB of FPGA 300 has a set of eighteen associated row lines, then each set of eighteen row lines is coupled to be controlled by the same write enable signal. This grouping enables each CLB to be accessed by a single write enable signal.

Figure 5:
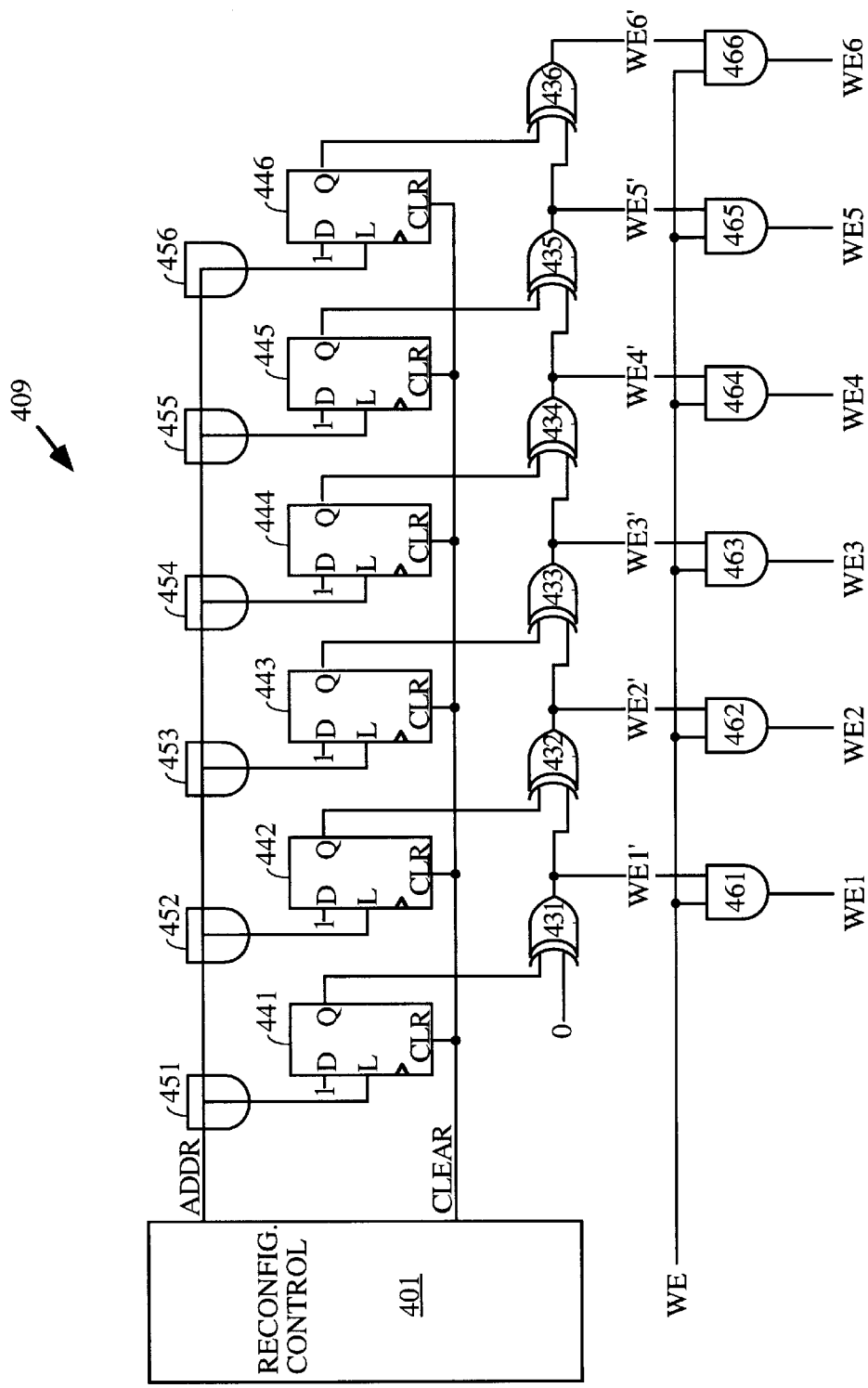
FIG. 5 is a schematic diagram of a row decoder in accordance with one embodiment of the invention.

FIG. 5 is a circuit diagram of a row decoder 409 in accordance with one embodiment of the invention. As described in more detail below, row decoder 409 is controlled to assert one or more write enable signals WE1–WE6. Row decoder 409 is designed to enable any consecutive group of write enable signals WE1–WE6 to be asserted with minimum overhead. Although only six write enable signals are illustrated in FIG. 5, it is understood that row decoder 409 can be expanded to provide many more write enable signals.

Row decoder 409 includes a reconfiguration control circuit 401, exclusive OR gates 431–436, flip-flops 441–446 and address decoders 451–456. The D input terminals of flip-flops 441–446 are coupled to receive a logic high signal. The load input terminals L of flip-flops 441–446 are coupled to the output terminals of address decoders 451–456, respectively. The Q output terminals of flip-flops 441–446 are coupled to input terminals of exclusive OR gates 431–436, respectively. The output terminals of exclusive OR gates 431–435 are coupled to input terminals of exclusive OR gates 432–436, respectively. An input terminal of exclusive OR gate 431 is coupled to receive a logic low signal.

The output terminals of exclusive OR gates 431–436 are coupled to provide write enable signals WE1'–WE6'. These signals are provided to AND gates 461–466, which also receive the global write enable signal WE and provide output signals WE1–WE6 to associated row access transistors (or groups of row access transistors).

Row decoder 409 operates as follows. Flip flops 441–446 are initially cleared in response to a CLEAR control signal received from reconfiguration control circuit 401. Reconfiguration control circuit 401 then provides a first address signal to each of the address decoders 451–456. Each of address decoders 451–456 is assigned a unique address. The first address signal is selected to correspond with the address decoder associated with the first write enable signal to be asserted. For example, if the write enable signal WE2 is the first of write enable signals WE1–WE6 to be asserted, then the first address signal is selected to correspond with the address assigned to address decoder 452. Under these conditions, the address decoder 452 asserts a logic high signal on the LOAD input terminal of flip flop 442. As a result, the logic high input signal provided at the D input terminal of flip flop 442 is latched into flip flop 442 and provided at the Q output terminal of flip flop 442. The logic high signal provided at the Q output terminal of flip flop 442 causes exclusive OR gate 432 to provide a logic high write enable signal WE2.

Reconfiguration control circuit 401 then generates a second address signal which is selected to correspond with the address decoder immediately after the last write enable signal to be asserted. For example, if the write enable signal WE4 is the last write enable signal to be asserted, then the second address signal is selected to correspond with the address assigned to address decoder 455. Under these conditions, the address decoder 455 asserts a logic high signal on the L input terminal of flip flop 445. As a result, the logic high input signal provided at the D input terminal of flip flop 445 is latched into flip flop 445 and provided at the Q output terminal of flip flop 445. The logic high signal provided at the Q output terminal of flip flop 445 is provided to exclusive OR gate 435.

The logic high signal provided by exclusive OR gate 432 is propagated through exclusive OR gates 433 and 434 (because flip flops 443 and 444 provide logic low Q output signals). As a result, when global write enable signal WE is high, logic high write enable signals WE3 and WE4 are generated. The logic high signal provided at the Q output terminal of flip flop 445 prevents the logic high write enable signal WE4 from propagating through exclusive OR gate 435.

To summarize, the write enable signals WE2–WE4 are asserted high, and the write enable signals WE1 and WE5–WE6 are de-asserted low. In the foregoing manner, any consecutive group of write enable signals can be asserted in response to a first address signal and a second address signal. This becomes particularly advantageous when the number of write enable signals becomes large.

By loading several pairs of logic 1 values into starting and ending flip flops, additional groups of adjacent rows can be selected.

Row decoder 409, as well as other row decoder circuits which can be used in connection with the present invention, is described in more detail in commonly owned, co-filed U.S. patent application Ser. No. 08/989,980, which is hereby incorporated by reference in its entirety.

Figure 6:
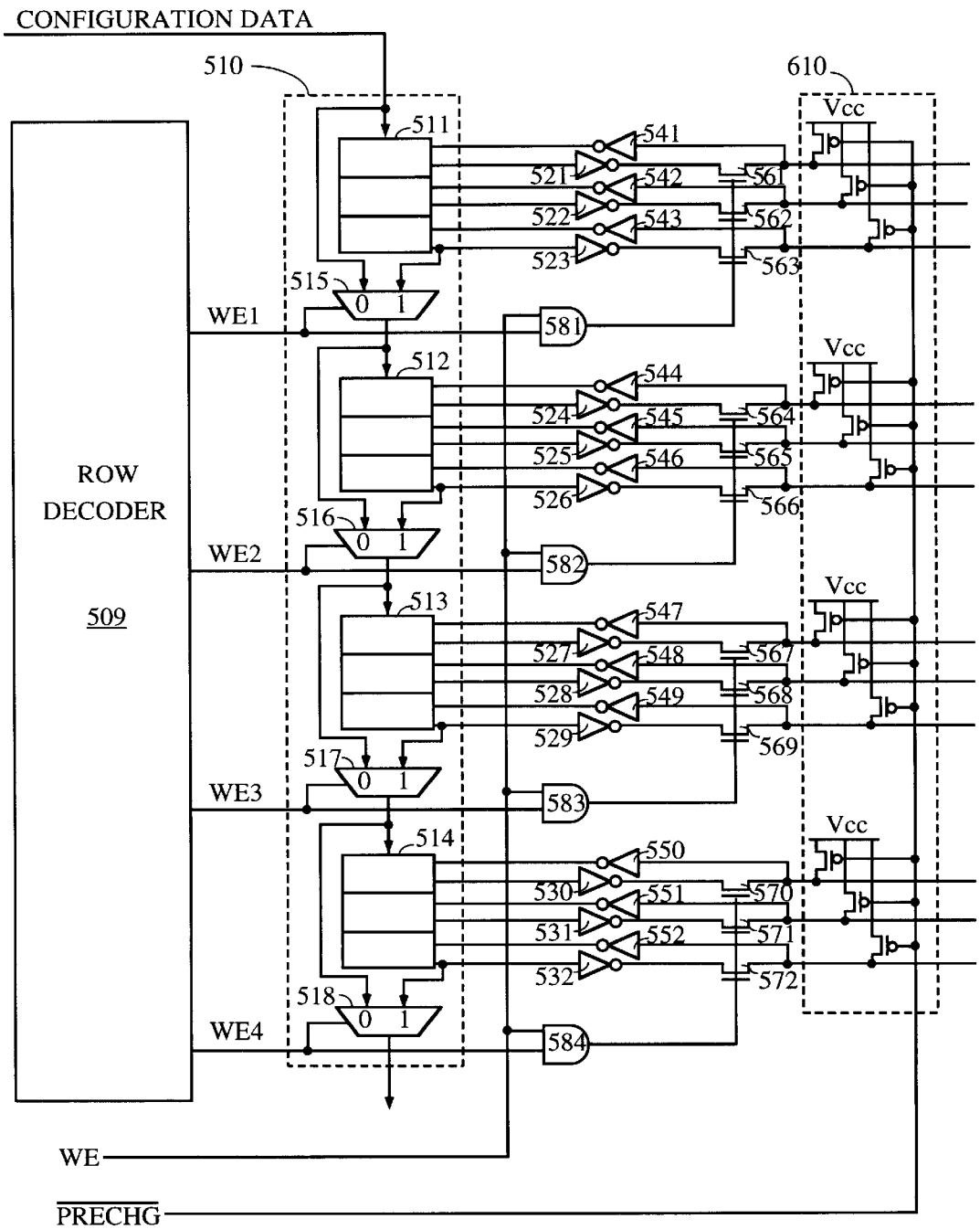
FIG. 6 is a circuit diagram of a frame register and a row decoder in accordance with another embodiment of the present invention.

FIG. 6 is a circuit diagram of a frame register 510 and a row decoder 509 in accordance with another embodiment of the present invention. Frame register 510 is coupled to write buffers 521–532, read buffers 541–552 and row access transistors 561–572. Row access transistors 561–572, in turn, are coupled to associated row lines and configuration memory cells (not shown) in the manner set forth in FIG. 2. Frame register 510 includes four shift registers 511–514 and four 2-to-1 multiplexers 515–518. Each shift register has three stages, with each stage being coupled to a corresponding write buffer, a corresponding read buffer and a corresponding row access transistor. Row decoder 509 generates four write enable signals WE1–WE4 as described in more detail below. Other embodiments implement shift registers having other numbers of stages and row decoders which generate other numbers of write enable signals.

Write enable signal WE1 is provided to the control terminal of multiplexer 515 and to an input terminal of AND gate 581. The other input terminal of AND gate 581 is coupled to receive a global write enable signal WE. The output terminal of AND gate 581 is coupled to the gates of row access transistors 561–563. Write enable signals WE2–WE4 are similarly connected as shown.

A serial configuration data stream is routed to shift register 511 and to the '0', input terminal of multiplexer 515. The output terminal of shift register 511 is coupled to the '1' input terminal of multiplexer 515. The output terminal of multiplexer 515 is coupled to the input terminal of shift register 512 and to the '0' input terminal of multiplexer 516. The foregoing pattern of connections is repeated for shift registers 512–514 and multiplexers 516–518.

The circuitry of FIG. 6 operates as follows to enable partial configuration. First, all row lines are precharged high using precharge circuit 610 controlled by the $\overline{\text{PRECHG}}$ signal. Next, a determination is made as to which configuration memory cells are to be written to accomplish the partial configuration. In the described example, only the configuration memory cells coupled to shift registers 512 and 514 are to be written (re-configured). Thus, three configuration data values must be shifted into shift register 512 and three configuration data values must be shifted into shift register 514. As described in more detail below, these configuration data values are loaded into shift registers 512 and 514 in a serial manner, while effectively bypassing shift registers 511 and 513. As a result, the time required to load the configuration data values in frame register 510 is advantageously minimized.

The six configuration data values are loaded into shift registers 512 and 514 as follows. The write enable signals associated with the shift registers to be loaded are asserted at logic high levels, and the write enable signals associated with the shift registers which are not to be loaded are de-asserted at logic low levels. Thus, row decoder 509 asserts write enable signals WE2 and WE4 at logic high levels and de-asserts write enable signals WE1 and WE3 at logic low levels.

The logic low write enable signal WE1 causes multiplexer 515 to route the first three configuration data values directly to shift register 512. Consequently, the first three clock signals shift the first three configuration data values into both shift registers 511 and 512.

The logic high write enable signal WE2 causes multiplexer 516 to pass the first three configuration data values from the output terminal of shift register 512 to the input terminal of shift register 513 and to the '0' input terminal of multiplexer 517. The logic low write enable signal WE3 causes multiplexer 517 to route the first three configuration data values to the input terminal of shift register 514. As a result, the next three clock signals shift the first three configuration data values from shift register 512 into shift registers 513 and 514.

At the same time that the first three configuration data values are being shifted into shift registers 513 and 514, the next three configuration data values are shifted into shift registers 511 and 512.

While the shift registers 511–514 are being loaded, the global write enable signal WE has a logic low level. As a result, AND gates 581–584 provide logic low output signals to the gates of row access transistors 561–572, thereby turning off these row access transistors. After the shift registers 511–514 have been loaded in the previously described manner, global write enable signal WE is asserted at a logic high level. The logic high global write enable signal WE, in combination with the logic high write enable signals WE2 and WE4, causes logic high signals to be provided at the output terminals of AND gates 582 and 584. These logic high signals cause row access transistors 564–566 and 570–572 to turn on in accordance with the previously described partial configuration operation, thereby causing the previously loaded configuration data values to be provided from shift registers 512 and 514 to the associated row lines. Note that row access transistors 561–563 and 567–569 are not turned on because the write enable signals WE1 and WE3 have logic low values.

The foregoing method allows the unused shift registers to be effectively bypassed while the configuration data values are loaded into frame register 510. As a result, the time required to load frame register 510 is greatly reduced.

Figure 1:
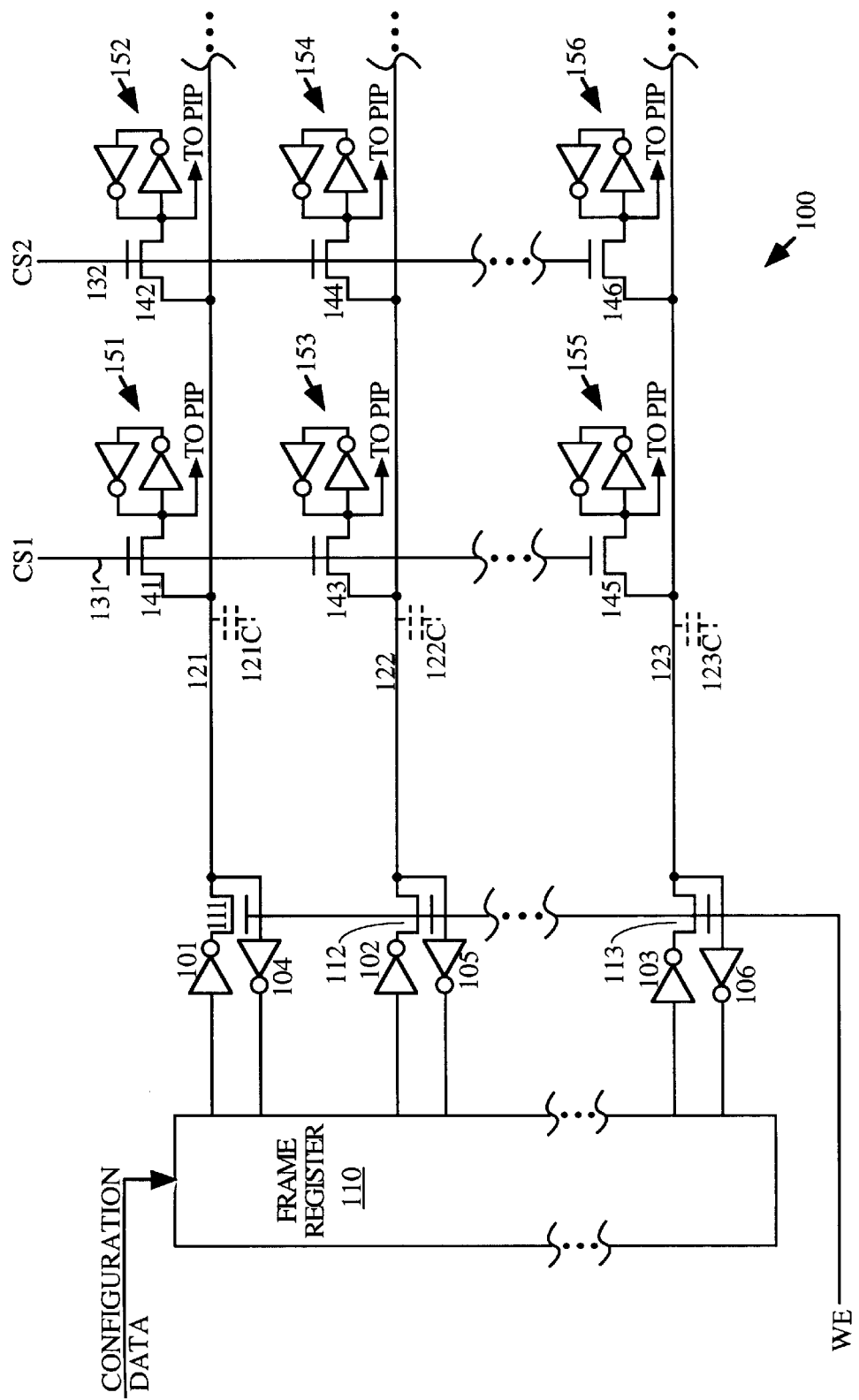
FIG. 1 is a schematic diagram of a portion of a conventional FPGA.

Although the present invention has been described in connection with several embodiments, it is understood that this invention is not limited to the embodiments disclosed, but is capable of various modifications which would be apparent to one of ordinary skill in the art. For example, different read and write voltages can be used based on the characteristics of the FPGA. Moreover, the read and write voltages can be asserted for different durations in different embodiments. For another example, although an explicit precharge line is shown in FIGS. 2, 4, and 6, other embodiments can precharge row lines through row access circuitry, as was described in connection with FIG. 1. Thus, the invention is limited only by the following claims.

We claim:

1. A field programmable gate array (FPGA) comprising:
a column of configuration memory cells that store configuration data values which are used to configure the FPGA;

a plurality of cell access transistors, each having a gate;

a plurality of row lines, wherein each row line is coupled to a corresponding one of the configuration memory cells by a corresponding one of the cell access transistors;

a row access circuit which provides configuration data values only to a selectable set of the row lines during a write operation;

a column select line coupled to the gate of each of the cell access transistors; and a column access circuit for applying a first voltage followed by a second voltage to the column select line during the write operation, wherein both the first voltage and the second voltage are sufficient to turn on the access transistors, and wherein the second voltage turns on the cell access transistors harder than the first voltage.

2. The FPGA of claim 1, wherein the row access circuit comprises:

a plurality of row access transistors, wherein each of the row access transistors is coupled to a corresponding one of the row lines;

a frame register coupled to provide configuration data values to the row access transistors; and a row decoder coupled to control the row access transistors, wherein the row decoder enables a selectable set of the row access transistors to pass the configuration data values from the frame register to the selectable set of the row lines.

3. The FPGA of claim 2, wherein each of the row access transistors has a dedicated connection to the row decoder.

4. The FPGA of claim 2, wherein a plurality of the row access transistors share a common connection to the row decoder.

5. The FPGA of claim 2, wherein the selectable set of row access transistors represents at least one consecutive group of the row access transistors, and wherein the row decoder generates a plurality of write enable signals to enable each consecutive group of the row access transistors, wherein the write enable signals are generated in response to a first address associated with a beginning of each consecutive group of row access transistors, and a second address associated with an end of each consecutive group of row access transistors.

6. The method of claim 2, wherein the frame register comprises circuitry for serially shifting the configuration data values into the frame register such that the configuration data values are shifted into locations within the frame register which correspond with the selectable set of the row access transistors.

7. The FPGA of claim 1, wherein the row access circuit further comprises circuitry for pre-charging each of the row lines to a logic high level.

8. The FPGA of claim 7, wherein the row lines not included in the selectable set of row lines are discharged by the configuration memory cells storing logical 0's that are coupled to the row lines not included in the selectable set of row lines while the first voltage is applied to the column select line.

9. The FPGA of claim 1, wherein the first voltage is about half of the second voltage.

10. The FPGA of claim 1, wherein the first voltage is selected such that configuration data values stored in configuration memory cells on rows not selected are undisturbed during the write operation.

11. The FPGA of claim 1, wherein each of the cell access transistors further comprises a source and a drain, wherein the drain of each of the cell access transistors is coupled to a corresponding one of the configuration memory cells, and the source of each of the cell access transistors is coupled to a corresponding row line.

12. A field programmable gate array (FPGA) comprising:

a column of configuration memory cells for storing configuration data values which are used to configure the FPGA;

a column of cell access transistors, wherein each of the cell access transistors is coupled to a corresponding one of the configuration memory cells;

a row access circuit for providing one or more configuration data values to a selectable set of the cell access transistors during a write operation; and a column access circuit for providing a column select signal to turn on the entire column of cell access transistors, wherein the column access signal comprises a first voltage followed by a second voltage, wherein both the first voltage and the second voltage are sufficient to turn on the cell access transistors, and wherein the second voltage turns on the cell access transistors harder than the first voltage.

13. The FPGA of claim 12, wherein the row access circuit is programmable to provide configuration data values to any consecutive selectable set of the cell access transistors in response to a first address which is representative of a beginning of the consecutive selectable set of the cell access transistors and a second address which is representative of an end of the consecutive selectable set of the cell access transistors.

14. The FPGA of claim 12, wherein the row access circuit comprises a shift register having circuitry which serially shifts the configuration data values into locations within the shift register which correspond with the selectable set of the cell access transistors.

15. The FPGA of claim 12, wherein the row access circuit comprises:

a plurality of row access transistors, wherein each of the row access transistors is coupled to a corresponding cell access transistor by a row line; and a row decoder coupled to the row access transistors, wherein there is a dedicated connection between each row access transistor and the row decoder.

16. The FPGA of claim 12, wherein the row access circuit comprises:

a plurality of row access transistors, wherein each of the row access transistors is coupled to a corresponding cell access transistor by a row line; and a row decoder coupled to the row access transistors, wherein there is a dedicated connection between a plurality of the row access transistors and the row decoder.

17. The FPGA of claim 16, wherein the dedicated connection is coupled to row access transistors associated with a configurable logic block of the FPGA.

18. A method for partially reconfiguring a field programmable gate array (FPGA) which comprises a column of configuration memory cells, each having an associated cell access transistor, wherein the configuration memory cells store configuration data values which are used to configure the FPGA, the method comprising the steps of:

providing configuration data values to a selectable set of the cell access transistors; and applying a column select signal to turn on all cell access transistors of the column, wherein the column select signal comprises a first voltage followed by a second voltage, wherein both the first voltage and the second voltage are sufficient to turn on each of the cell access transistors, and wherein the second voltage turns on the cell access transistors harder than the first voltage.

19. The method of claim 18, wherein each of the cell access transistors is coupled to a corresponding row line, the method further comprising the step of pre-charging each row line prior to the step of applying the column select signal.

20. The method of claim 18, further comprising the steps of serially shifting the configuration data values into a shift register, wherein the configuration data values are shifted directly into locations within the shift register which correspond with the selectable set of the cell access transistors.

21. The method of claim 18, wherein each of the cell access transistors is coupled to a corresponding row line and a corresponding row access transistor, the method further comprising the steps of:
   providing the configuration data values to a selectable set of the row access transistors; and
   providing write enable signals to the selectable set of row access transistors, wherein the write enable signals turn on the selectable set of row access transistors, thereby causing the selectable set of row access transistors to provide the configuration data values to the selectable set of cell access transistors, wherein each of the row access transistors in the selectable set of row access transistors receives a dedicated write enable signal.

22. The method of claim 18, wherein each of the cell access transistors is coupled to a corresponding row line and a corresponding row access transistor, the method further comprising the steps of:
   providing the configuration data values to a selectable set of the row access transistors; and
   providing write enable signals to the selectable set of row access transistors, wherein the write enable signals turn on the selectable set of row access transistors, thereby causing the selectable set of row access transistors to provide the configuration data values to the selectable set of cell access transistors, wherein a plurality of the row access transistors in the selectable set of row access transistors receives a dedicated write enable signal.

23. The method of claim 18, wherein each of the cell access transistors is coupled to a corresponding row line and a corresponding row access transistor, the method further comprising the steps of:
   providing the configuration data values to a consecutive group of the row access transistors; and
   providing write enable signals to the consecutive group of row access transistors in response to a first address associated with a beginning of the consecutive group of row access transistors and a second address associated with an end of the consecutive group of row access transistors, wherein the write enable signals turn on the consecutive group of row access transistors, thereby causing the consecutive group of row access transistors to provide the configuration data values to the selectable set of cell access transistors.

24. A field programmable gate array (FPGA) comprising:
   at least one column of configuration memory cells;
   for each of the configuration memory cells, a corresponding row access line and a cell access transistor connecting the corresponding row access line to the configuration memory cell;
   a column access circuit for selectively applying a read voltage, a write voltage, or an off voltage to the cell access transistors; and
   a row access circuit for applying data values to a selected subset of the row access lines.

25. The FPGA of claim 24 wherein the column access circuit applies the read voltage followed by the write voltage to the cell access transistors during a write operation, wherein the write voltage causes the cell access transistor to have a lower impedance than does the read voltage.

* * * * *